Oct. 10, 1961 C. A. LEVI 3,003,900

METHOD FOR DIFFUSING ACTIVE IMPURITIES INTO SEMICONDUCTOR MATERIALS

Filed Nov. 12, 1957

CLIFFORD A. LEVI,
INVENTOR.

By Spensley and Horn

ATTORNEYS.

United States Patent Office 3,003,900

Patented Oct. 10, 1961

3,003,900

METHOD FOR DIFFUSING ACTIVE IMPURITIES INTO SEMICONDUCTOR MATERIALS

Clifford A. Levi, North Hollywood, Calif., assignor to Pacific Semiconductors, Inc., Culver City, Calif., a corporation of Delaware Filed Nov. 12, 1957, Ser. No. 695,769
14 Claims. (Cl. 148—1.5)

This invention relates to junction type semiconductor electrical translating devices and more particularly to a new method for producing the same.

In the semiconductor art, a region of semiconductor material containing an excess of donor impurities and having an excess of free electrons is considered to be an N-type region, while a P-type region is one containing an excess of acceptor impurities resulting in a deficit of electrons, or stated differently, an excess of holes. When a continuous solid specimen of single crystal semiconductor material has an N-type region adjacent a P-type region, the boundary between them is termed a P-N (or N-P) junction; and a specimen of semiconductor material is termed a P-N junction semiconductor device. A specimen having two N-type regions separated by a P-type region, for example, is termed an N-P-N junction semiconductor device or transistor, while a specimen having two P-type regions separated by an N-type region is termed a P-N-P junction semiconductor device or transistor.

These P-N or N-P junctions are hereinafter referred to as rectifying junctions or simply as junctions. It is often desirable to provide a non-rectifying junction or ohmic contact to a semiconductor material or a portion thereof. If such an ohmic contact is made to a P-type region the conductivity of the region adjacent the crystal to which contact is made is often referred to as a P+-type region when contact is made to a P-type crystal or an N+-type region when contact is made to an N-type crystal. The method of the present invention is particularly adapted to the production of both rectifying and non-rectifying junctions by the phenomenon of diffusion of active impurity atoms into the semiconductor starting crystal. When a P-type starting crystal such as germanium, for example, of a given resistivity has acceptor impurity atoms diffused therein a diffused P+-type region of a different resistivity is produced. The gradation between these two regions is what has herein been termed a non-rectifying junction and may be useful in producing an ohmic contact. The term junction therefore for the purpose of this invention is intended to include both rectifying and non-rectifying junctions.

The term active impurity is used to denote those impurities which affect the electrical rectification characteristics of semiconductor materials as distinguished from other impurities which have no appreciable effect upon these characteristics. Active impurities are ordinarily classified as donor impurities such as phosphorous, arsenic, antimony and bismuth or acceptor impurities such as boron, aluminum, gallium and indium.

Prior art diffusion methods for producing junction devices such as diodes or transistors often resulted in the inadvertent introduction of rapidly diffusing acceptors into the crystal into which diffusion was taking place. The term "rapidly diffusing acceptors" as utilized herein refers to such elements as copper, for example, which are not purposely introduced, as opposed to the above referred to acceptor impurities such as boron, aluminum, gallium and indium which are purposely introduced.

This problem has in the past intervened between the design and the realization of semiconductor diffusion devices, where maintenance of high resistivity in the base material is critical. These undesirable rapidly diffusing acceptors or other impurities not to be confused with the desirable acceptor impurities mentioned hereinabove, may be present in the apparatus wherein the diffusion is taking place. They may have been present in the original semiconductor crystal or may be present in the active impurity source itself. These undesirable rapidly diffusing acceptor impurities which include copper, gold, nickel, iron and the like tend to diffuse with extreme speed and therefore make it difficult to produce devices having predictable characteristics. They themselves are ineffective to produce junctions as their extreme speed of diffusion would permeate the entire crystal within a very short time. If the crystal were originally of P-type conductivity, of course, it would, after diffusion of these undesirable impurities, be of P+ conductivity. On the other hand, if the device or starting crystal were originally of N-type conductivity the introduction or the rapid diffusion of these impurities would result in reducing the N-type conductivity, making it more nearly intrinsic or if it be present in sufficient quantity, will convert the conductivity of the entire crystal to P-type conductivity.

The method of the present invention may be described as the vapor transport-molten getter diffusion process providing a means for avoiding the introduction of these impurities during diffusion and of their removal if already present in the system.

The method of the present invention consists of diffusing the semiconductor, such as a germanium substrate, in a closed system containing a molten sink in which the rapidly diffusing acceptors are highly soluble with a gas capable of reacting with the acceptors, the product of the reaction being more volatile than the rapidly diffusing acceptors. This vapor phase provides transport of the rapidly diffusing acceptors to the sink without physical contact between them. In short, what is provided is a method for avoiding conversion of the conductivity type of the crystal during diffusion.

Accordingly, it is an object of the present invention to provide a new method for diffusing active impurity elements into semiconductor materials.

A further object of the present invention is to provide a new method for producing large area diffused junction semiconductor devices.

A still further object of the invention is to provide a method for producing diffused junctions in semiconductor crystals without attendant conversion being caused by rapidly diffusing acceptor impurities present in the system.

Yet another object of the present invention is to provide a method for removing rapidly diffusing acceptors or inhibiting their introduction into a semiconductor crystal body.

The novel features which are believed to be characteristic of the present invention both as to its organization and method of operation, together with other objects and advantages thereof will be better understood from the following description considered in connection with the accompanying drawing in which one embodiment of the invention is illustrated by way of example. It is to be expressly understood, however, that the drawing is for the purpose of illustration and description only, and is not intended as a definition of the limits of the invention.

Figure 1:
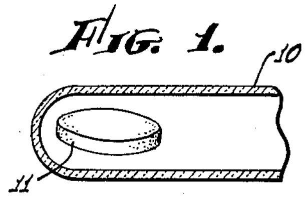
FIGURE 1 is a cross-sectional view of the rapidly diffusing acceptor impurity sink in its solid wafer form within a portion of a quartz tube.

Referring now to the drawing, there is shown in FIGURE 1 a portion of an open tube 10, which may be of quartz, or the like, in which there has been deposited a solid specimen of getter material 11, herein a tin-germanium alloy. The ratio of the weight of tin to germanium in the alloy may be in the range of 1–1 to 1–2.

In the illustrative example of the method according to the present invention hereinafter to be described it is assumed that the sink consists of a tin-germanium alloy and that it is desired to diffuse arsenic into a body of germanium as the semiconductor material. With germanium as the semiconductor material, sinks other than tin-germanium alloy may be used. The requirements placed upon the sink or getter when used with germanium are: that it be molten at the diffusion temperature, and have a high solubility of rapidly diffusing acceptor impurities, i.e., greater than 10% at diffusion temperature, have a sufficiently low vapor pressure so that mass transport of the sink material does not occur. Examples of such sink materials are: gallium, gallium-germanium alloy and aluminum-germanium alloy.

The method of the present invention is also applicable to diffuse arsenic or some other active impurity into silicon as the semiconductor material to achieve the stated objectives. The same requirements for the sink material obtained for silicon as were enumerated for germanium above, bearing in mind, of course, that the diffusion temperature of silicon is higher than that of germanium. Examples of sink materials for silicon bodies are: germanium-silicon alloy, e.g. a saturated solution of silicon in germanium which may be approximately 1 part germanium to 2 parts silicon, by weight.

If either a body of silicon or germanium material is to be processed according to the method of the present invention the impurity sink may in certain instances have to meet still another requirement. If the conductivity type or resistivity of the semiconductor body must not be altered, then the impurity sink must be inert to the semiconductor material, i.e., an active impurity containing sink may then not be permissible.

Figure 2:
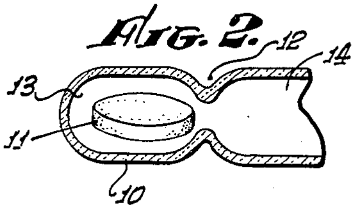
FIGURE 2 shows the quartz tube of FIGURE 1 which has been necked down to divide the tube into two separate communicating compartments.
Figure 7:
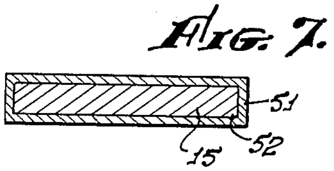
FIGURE 7 is a cross-sectional view of the wafer of FIGURE 6 after the diffusion operation.

With the getter 11 within open tube 10, the tube thereafter is necked down as at 12 by means of a hydrogen-oxygen torch, for example, thus providing two communicating compartments 13 and 14 within tube 10 as may be seen in FIGURE 2.

Figure 3:
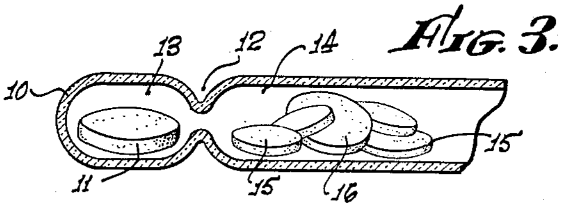
FIGURE 3 is a view of the tube of FIGURE 2 in which germanium wafers and an impurity source have been added to the second portion of the tube.

In FIGURE 3, with getter 11 still within portion 13 of tube 10, there is placed within portion 14 of the tube, a plurality of germanium wafers 15 and a solid specimen of material 16, preferably in wafer form. Specimen 16 may be an alloy of germanium and arsenic, for example, and serves as the active impurity source. Other active impurity sources such as germanium-antimony alloys or the like may also be employed. In fact any active impurity may be employed.

Figure 4:
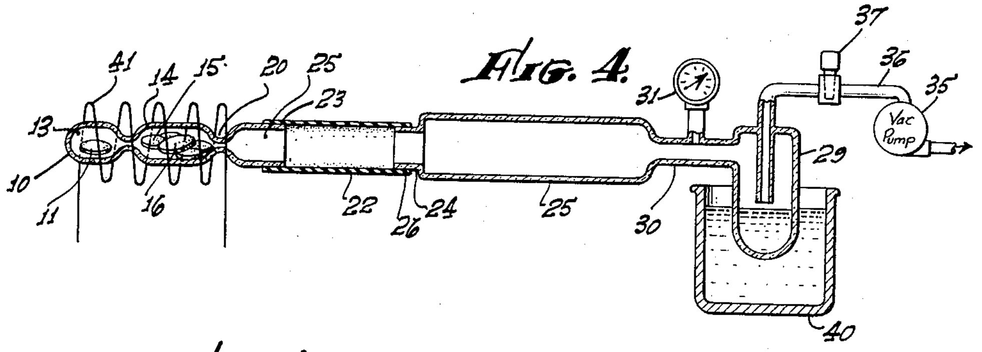
FIGURE 4 is a view, partly in section, of the apparatus which may be used according to the method of the present invention.

Tube 10 is thereafter again necked down as at 20 (see FIGURE 4) dividing tube 10 into three communicating compartments 13, 14 and 21. Tube 10 now has compartment 21 thereof connected to the apparatus of FIGURE 4 by means of connecting hose 22 with a seal therebetween at 23. The other end of hose 22 is connected to extension 24 of glass tube 25 to form a seal therebetween at 26. Tube 25 communicates with freeze out trap 29 by means of section 30 which has a pressure meter 31 connected thereto. Container 29 is partially filled with liquid carbon tetrachloride or some other volatile halide or halogen. Vacuum pump 35 is connected to container 29 through the extension 36 which extends into container 29. Stop-cock 37 is provided in extension 36 to permit the system to be closed off. Finally, container 29 is immersed in Dewar flask 40 which is filled with liquid nitrogen or the like.

Having thus described the apparatus which may be used to carry out the method of the present invention an explanation of its operation will now be presented. After the tube 10 is connected to the apparatus as described, the vacuum pump 35 begins to evacuate the system to a pressure of approximately 15 microns of mercury. This is done after the liquid nitrogen has frozen the carbon tetrachloride contained in 29. Now with the pump still running, tube 10 is inserted into a furnace schematically represented by heating coil 41. The tube is then heated to a temperature of approximately 400° C., and kept at that temperature for 30 minutes or thereabouts. Thereafter the heater of the furnace is de-energized permitting the tube 10 to cool to room temperature. It should be noted at this point that while it is preferable to perform this heating step it is not necessary.

After the system has been permitted to cool the stop-cock 37 is shut off and the liquid nitrogen in Dewar flask 40 is removed from the freeze out trap 29 or Dewar flask 40, thus permitting the carbon tetrachloride to return to room temperature; this fills tube 10 with about 3.5 inches of mercury pressure of $CCl_4$ vapor. Now the tube 10 is sealed off at the second necked down region 20 by the use of a hydrogen-oxygen torch or the like, resulting in the two compartment sealed capsule which is shown in FIGURE 5 with a partial pressure $CCl_4$.

Figure 6:
FIGURE 6 is a cross-sectional view of a germanium wafer prior to diffusion.
Figure 5:
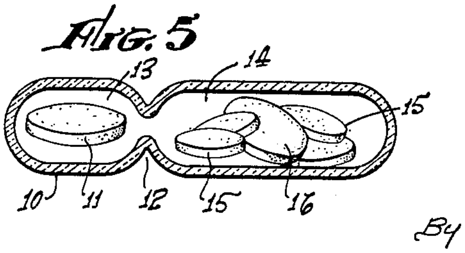
FIGURE 5 is a view, partly in section, of the tube of FIGURE 4 after it has been sealed prior to the diffusion step according to the method of the present invention.

The capsule of FIGURE 5 is then placed into an oven and heated to approximately 100° C. for two hours during which the diffusion of arsenic from the impurity source wafer 16 will take place to form a junction at 52 within germanium wafer 15 which is shown in cross-section in FIGURE 6. After diffusion region 51 of crystal 15 will have been converted from N-type conductivity of P-type conductivity, resulting in P–N junction 52 therebetween.

The above described diffusion step in accordance with present art techniques, will obviate the introduction, during diffusion of rapidly diffusing acceptors, if the previously described novel steps are taken according to the method of the present invention.

An explanation of the physics involved in the hereinabove described method will now be undertaken to explain how the rapidly diffusing acceptor impurities are inhibited from affecting the resistivity, conductivity type and lifetime of the semiconductor crystals into which diffusion takes place.

The thermodynamic properties of copper in solid and liquid solutions of germanium is well known. The diffusion constant of copper at 800° C. is $2.7\times10^{-5}$. By way of comparison, this rate is about 7 orders of magnitude faster than boron which is one of the faster acceptors.

A comparison of the solid and liquid solutions shows that copper is about 6–7 orders of magnitude more soluble in the liquid phase than in the solid phase at 100° C.

It should be stated at this point that while copper has been discussed as the responsible substance causing conversion in germanium, such elements as gold, iron and nickel may be equally responsible. The method of the present invention is equally applicable to these other rapidly diffusing acceptor elements.

Among the prior art methods for minimizing copper contamination are the following: the use of molten cyanide as a getter, the evaporation of copper from the substrate in vacuum and the gettering of copper by molten metals in contact with the germanium wafers. It has been found by the inventor that molten cyanide does not give consistent results and that it further results in etching of the surface of the germanium wafers. Diffusion during evaporation of copper in a vacuum has been found difficult to control and is not always effective in preventing conversion. Finally, gettering in contact with molten metals has been found to have the side effect of resulting in a loss of dimensional control of the germanium wafers due to unpredictable alloying action.

The method of the present invention overcomes these difficulties as it allows diffusion to proceed normally, and at the same time serves to remove copper in the system or in the substrate to a sink or getter. Physical separation of the sink and the substrate being gettered in the present invention is made possible by a vapor phase transport of copper to the sink from the substrate.

The present invention method may be viewed as achieving its purposes in four steps. In step 1 copper diffusing from the substrate reacts with the chlorine from the $CCl_4$ to form copper chloride. In step two, copper chloride, being volatile, diffuses in the gaseous state to the surface of the molten sink where decomposition thereof takes place, the latter being step 3. Finally, in step 4, the copper liberated by the decomposition dissolves in the sink. This last step is essentially an irreversible one as copper has a high solubility in the melt.

Halogens or halides other than $CCl_4$ may be used according to the present invention. The requirements for the halide or halogen which may be used according to the method of the present invention are that it must decompose at the diffusion temperature of the semiconductor body sufficient to release some elemental halogen to permit the reaction between the rapidly diffusing acceptor impurity and the halogen while acting as a carrier therefor in the vapor phase. Further, the compound resulting from the reaction between the halogen and the rapidly diffusing acceptor must have a vapor pressure which is substantially greater than the rapidly diffusing acceptor itself. Examples of such halogens are $CCl_4$, $CHCl_3$, $CHI_3$ and $CHBr_3$.

Thus the method of the present invention permits diffusion of donors or acceptors from the impurity source into germanium and at the same time, limits the copper concentration in the substrate to a level well below the intrinsic impurity level for germanium which is $2.5\times10^{13}$ atoms per cubic centimeter.

An example of a rapidly diffusing acceptor donor sink for copper is a ten gram block of one part tin and one part germanium alloy. The amount of carbon tetrachloride introduced into container or tube 10 should be equivalent to its room temperature equilibrium pressure, which is approximately 2½″–3½″ of mercury. It has been found that the arrangement of the wafers 15 into which diffusion is to take place is not all critical.

In the development of the present invention method, pure intrinsic germanium was first used as a sink, rather than a tin-germanium alloy. This was found to be unsatisfactory, however, due to the thermal gradients created when the sink was heated above the melting point of germanium as mass transport occurred resulting in the growth of crystals of germanium on the surface of the substrate. This mass transport is avoided by the present invention method which employ a saturated solution of germanium and tin as the getter which becomes molten at the diffusion temperature, this avoiding a thermal gradient yet being effective as a getter. In order to avoid etching of the wafer surfaces it has been found necessary to hold the temperature gradient within the tube or capsule in the hot zone thereof within 5° C. The maximum permissible gradient in general, depends upon the diffusion time. Obviously, the larger the diffusion, the smaller the gradient that can be tolerated. The time of diffusion, of course, depends upon the device design. It has been found by the inventor that little change in resistivity occurs with the method of the present invention.

There has thus been described a novel method for carrying out solid state diffusion into semiconductor materials while avoiding unwanted contaminents with the accompanying degradation of lifetime and conversion to low resistivity P-type conductivity, with no change of dimension or uncontrollable alloying and permitting precise geometric control of the structure fabricated. It is also apparent that the method of the present invention may be employed merely to remove rapidly diffusing acceptors from a semiconductor body substrate without diffusing of any active impurity therein, if desired.

What is claimed is:

1. In a semiconductor crystal body the method of reducing the concentration of a rapidly diffusing acceptor impurity which affects the electrical characteristics of said body including the steps of: placing a body of semiconductor material together with a source of halogen atoms into a first portion of a sealed container; placing a solid metallic sink into a second portion of said container; and heating said container to at least the diffusion temperature of said rapidly diffusing acceptor impurity, said temperature being greater than the melting point of said metallic sink, but below the melting point of said semiconductor material.

2. In a semiconductor crystal body the method of reducing the concentration of a rapidly diffusing acceptor impurity which affects the electrical characteristics of said body including the steps of: placing a body of semiconductor material together with a halogen compound into a first portion of a sealed container, said compound being decomposable at the diffusion temperature of the rapidly diffusing acceptor impurity; placing a solid metallic sink into a second portion of said container; and heating said container to at least the diffusion temperature of said rapidly diffusing acceptor impurity, said temperature being greater than the melting point of said metallic sink, but below the melting point of said semiconductor material.

3. In a germanium semiconductor crystal body the method of reducing the concentration of a rapidly diffusing acceptor impurity which affects the electrical characteristics of said body including the steps of: placing a body of germanium semiconductor material together with a source of halogen atoms into a first portion of a sealed container; placing a solid metallic sink into a second portion of said sealed container; and heating said container to at least the diffusion temperature of said rapidly diffusing acceptor impurity, said temperature being greater than the melting point of said metallic sink, but below the melting point of said semiconductor material.

4. In a germanium semiconductor crystal body the method of reducing the concentration of copper as a rapidly diffusing acceptor impurity which affects the electrical characteristics of said body including the steps of: placing a body of germanium semiconductor material together with a halogen compound into a first portion of a sealed container, said compound being decomposable at the diffusion temperature of copper; placing a solid metallic sink into a second portion of said container, said metallic sink being capable, when molten, of absorbing said rapidly diffusing acceptor impurity which has combined with the halogen atoms of said halogen compound; and heating said container to at least the diffusion temperature of copper, said temperature being greater than the melting point of said metallic sink, but below the melting point of said semiconductor material.

5. In a germanium semiconductor crystal body the method of reducing the concentration of a rapidly diffusing acceptor impurity which affects the electrical characteristics of said body including the steps of: placing a body of germanium semiconductor material together with a halogen compound into a first portion of a sealed container, said compound being decomposable at the diffusion temperature of the rapidly diffusing acceptor impurity; placing a body of tin germanium alloy into a second portion of said container; and heating said container to at least the diffusion temperature of said rapidly diffusing acceptor impurity, said temperature being greater than the melting point of said metallic sink, but below the melting point of said semiconductor material.

6. The method of diffusing an active impurity into a germanium semiconductor crystal body while avoiding the presence of a rapidly diffusing acceptor impurity in said body including the steps of: placing a body of germanium-arsenic alloy and a body of germanium semiconductor material together with a source of halogen atoms into a first portion of a sealed container; placing a solid metallic sink into a second portion of said container; and heating said container to a temperature which will permit some atoms of arsenic from said alloy to diffuse into said semiconductor body, said temperature being greater than the melting point of said metallic sink, but below the melting point of said semiconductor material.

7. The method of diffusing an active impurity into a germanium semiconductor crystal body while avoiding the presence of a rapidly diffusing acceptor impurity in said body including the steps of: placing a body of germanium-arsenic alloy and a body of germanium semiconductor material together with a halogen compound into a first portion of a sealed container, said compound being decomposable at the diffusion temperature of the rapidly diffusing acceptor impurity; placing a body of tin-germanium alloy into a second portion of said container; and heating said container to a temperature which will permit some atoms of arsenic to diffuse into said semiconductor body, said temperature being greater than the melting point of said alloy, but below the melting point of said semiconductor material.

8. In a silicon semiconductor crystal body the method of reducing the concentration of a rapidly diffusing acceptor impurity which affects the electrical characteristics of said body including the steps of: placing a body of silicon semiconductor material together with a source of halogen atoms into first portion of a sealed container; placing a solid metallic sink into a second portion of said sealed container; and heating said container to at least the diffusion temperature of said rapidly diffusing acceptor impurity, said temperature being greater than the melting point of said metallic sink, but below the melting point of said semiconductor material.

9. In a silicon semiconductor crystal body the method of reducing the concentration of a rapidly diffusing acceptor impurity which affects the electrical characteristics of said body including the steps of: placing a body of silicon semiconductor material together with a halogen compound into a first portion of a sealed container, said compound being decomposable at the diffusion temperature of said rapidly diffusing acceptor impurity; placing a solid metallic sink into a second portion of said container; and heating said container to at least the diffusion temperature of said rapidly diffusing acceptor impurity, said temperature being greater than the melting point of said metallic sink, but below the melting point of said semiconductor material.

10. In a silicon semiconductor crystal body the method of reducing the concentration of a rapidly diffusing acceptor impurity which affects the electrical characteristics of said body including the steps of: placing a body of silicon semiconductor material together with a halogen compound into a first portion of a sealed container, said compound being decomposable at the diffusion temperature of the rapidly diffusing acceptor impurity; placing a body of germanium-silicon alloy into a second portion of said container; and heating said container to at least the diffusion temperature of said rapidly diffusing acceptor impurity, said temperature being greater than the melting point of said alloy, but below the melting point of said semiconductor material.

11. The method of diffusing an active impurity into a silicon semiconductor crystal body while excluding the presence of a rapidly diffusing acceptor impurity in said body including the steps of: placing an active impurity source and a body of silicon semiconductor material together with a source of halogen atoms into a first portion of a sealed container; placing a solid metallic sink into a second portion of said container; and heating said container to a temperature which will permit some atoms of said active impurity to diffuse into said semiconductor body, said temperature being greater than the melting point of said metallic sink, but below the melting point of said semiconductor material.

12. The method of diffusing arsenic into a silicon semiconductor crystal body while excluding the presence of a rapidly diffusing acceptor impurity in said body including the steps of: placing source arsenic and a body of silicon semiconductor material together with a halogen compound into a first portion of a sealed container, said compound being decomposable at the diffusion temperature of the rapidly diffusing acceptor impurity; placing a solid metallic sink into a second portion of said container; and heating said container to a temperature which will permit some atoms of arsenic to diffuse into a semiconductor body, said temperature being greater than the melting point of said metallic sink, but below the melting point of said semiconductor material.

13. In a semiconductor crystal body the method of reducing the concentration of a rapidly diffusing acceptor impurity which affects the electrical characteristics of said body including the steps of: placing a body of semiconductor material together with a source of halogen atoms into a first portion of a sealed container; placing a solid metallic sink into a second portion of said container; and heating said container to at least the diffusion temperature of said rapidly diffusing acceptor impurity to permit said halogen atoms to combine with said rapidly diffusing acceptor impurity to form a volatile compound which is absorbable by said metallic sink, said temperature being greater than the melting point of said metallic sink, but below the melting point of said semiconductor material.

14. The method of diffusing a desired active slowly diffusing impurity into a semiconductor crystal body while reducing the concentration of an undesired rapidly diffusing impurity which adversely affects the electrical characteristics of said body comprising the steps of: placing a source of said active impurity and said body of semiconductor material in a first portion of a container, placing in a second portion of said container a solid metallic sink of a material in the liquid state of which said undesired impurity is soluble, providing in said container an atmosphere of a gas which reacts with said undesired impurity to form a volatile rapidly diffusing compound which is decomposable by contact with the material of said metallic sink, sealing said container, and heating said container to a temperature at least equal to the diffusion temperature of said rapidly diffusing impurity and greater than the temperature of the melting point of the material of said metallic sink, but below the melting point of said semiconductor material.

(References on following page)

References Cited in the file of this patent

UNITED STATES PATENTS

| | | |
|---|---|---|
| 843,563 | Firth | Feb. 5, 1907 |
| 1,086,019 | Bucher | Feb. 3, 1914 |
| 1,211,635 | Smith | Jan. 9, 1917 |
| 1,968,442 | Clark | July 31, 1934 |
| 2,552,626 | Fisher et al. | May 15, 1951 |
| 2,685,728 | Ohl | Aug. 10, 1954 |
| 2,692,839 | Christensen | Oct. 26, 1954 |
| 2,834,697 | Smits | May 13, 1958 |
| 2,844,460 | Finn | July 22, 1958 |
| 2,849,343 | Kroger | Aug. 26, 1958 |

FOREIGN PATENTS

| | | |
|---|---|---|
| 690,243 | Great Britain | Apr. 15, 1953 |
| 203,350 | Australia | Nov. 10, 1954 |

OTHER REFERENCES

Semiconductor Abstracts, vol. IV, 1956, page 81, abtract No. 279.